(12) United States Patent
Kwok

(10) Patent No.: US 9,054,742 B2
(45) Date of Patent: Jun. 9, 2015

(54) ERROR AND ERASURE DECODING APPARATUS AND METHOD

(71) Applicant: Intel Corporation, Santa Clara, CA (US)

(72) Inventor: Zion S. Kwok, Burnaby (CA)

(73) Assignee: Intel Corporation, Santa Clara, CA (US)

( * ) Notice: Subject to any disclaimer, the term of this patent is extended or adjusted under 35 U.S.C. 154(b) by 131 days.

(21) Appl. No.: 13/829,907

(22) Filed: Mar. 14, 2013

(65) Prior Publication Data

US 2014/0281839 A1  Sep. 18, 2014

(51) Int. Cl.
H03M 13/00 (2006.01)
H03M 13/15 (2006.01)

(52) U.S. Cl.
CPC ........ *H03M 13/1515* (2013.01); *H03M 13/153* (2013.01); *H03M 13/154* (2013.01); *H03M 13/159* (2013.01)

(58) Field of Classification Search
None
See application file for complete search history.

(56) References Cited

U.S. PATENT DOCUMENTS

| | | | | | |
|---|---|---|---|---|---|
| 4,868,828 | A | * | 9/1989 | Shao et al. | 714/704 |
| 5,020,060 | A | * | 5/1991 | Murai et al. | 714/784 |
| 5,170,399 | A | * | 12/1992 | Cameron et al. | 714/784 |
| 5,373,511 | A | * | 12/1994 | Veksler | 714/755 |
| 5,715,262 | A | * | 2/1998 | Gupta | 714/784 |
| 5,875,199 | A | * | 2/1999 | Luthi | 714/780 |
| 6,553,536 | B1 | * | 4/2003 | Hassner et al. | 714/780 |
| 6,772,390 | B2 | * | 8/2004 | Weng et al. | 714/785 |
| 6,832,042 | B1 | * | 12/2004 | Shieh | 386/264 |
| 7,096,409 | B2 | * | 8/2006 | Banks | 714/784 |
| 8,413,023 | B2 | * | 4/2013 | Ashe et al. | 714/781 |
| 2007/0143659 | A1 | * | 6/2007 | Ball | 714/755 |
| 2010/0031127 | A1 | * | 2/2010 | Panteleev et al. | 714/784 |
| 2010/0174969 | A1 | * | 7/2010 | Ashe et al. | 714/781 |
| 2011/0239094 | A1 | * | 9/2011 | Kwok et al. | 714/782 |

* cited by examiner

*Primary Examiner* — Daniel McMahon
(74) *Attorney, Agent, or Firm* — Schwabe, Williamson & Wyatt, P.C.

(57) ABSTRACT

A codeword may have errors and erasures. In embodiments, an apparatus may include a syndrome calculator configured to generate partial syndromes of the codeword, an erasure locator configured to generate an erasure locator polynomial, and a syndrome modifier configured to generate modified partial syndromes based at least in part on the partial syndromes and the erasure locator polynomial. The apparatus may further include an error locator configured to generate an error locator polynomial using the modified partial syndromes, for error and erasure decoding of the codeword.

16 Claims, 5 Drawing Sheets

ERROR AND ERASURE DECODING APPARATUS AND METHOD

FIELD OF THE INVENTION

The present disclosure relates generally to microprocessor and memory apparatuses and methods, and more particularly, apparatuses and methods for decoding errors and erasures.

BACKGROUND

In coding theory, an erasure is a potential error with a known location. When receiving a codeword transmitted over a noisy channel, or reading a codeword from a memory device, unreliable bits in the codeword may be flagged as erasures. Flagging a symbol as an erasure typically uses the correction strength of only half of a symbol.

Reed-Solomon (RS) codes are non-binary cyclic error-correcting codes invented by Irving S. Reed and Gustave Solomon. RS codes may detect and correct multiple random errors. Moreover, RS codes may detect and correct combinations of errors and erasures as an erasure code. Furthermore, RS codes may also detect and correct multiple-burst bit-errors.

The Berlekamp-Massey algorithm (BMA) may be used in RS codes to find the error locator polynomial, for calculating error values for error decoding. However, BMA may not work correctly if the number of erasures is greater than the nominal error correction strength of the code.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
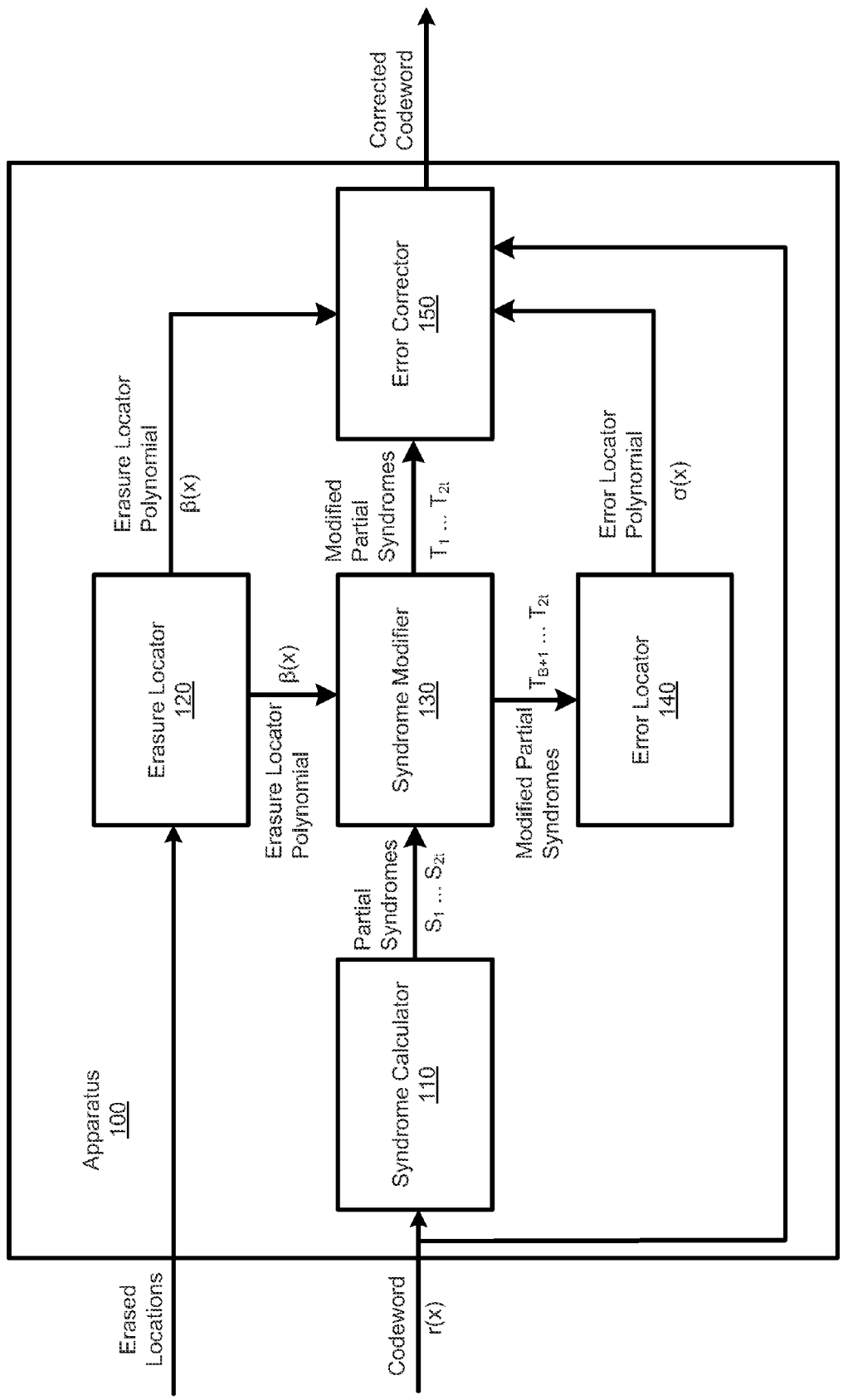
FIG. 1 is a block diagram illustrating an example apparatus incorporating aspects of the present disclosure, in accordance with various embodiments.

Embodiments of apparatus and methods for error and erasure decoding are described. A codeword may have errors and erasures. In embodiments, an apparatus may include a syndrome calculator configured to generate partial syndromes of the codeword, an erasure locator configured to generate an erasure locator polynomial. The apparatus may also include a syndrome modifier configured to generate modified partial syndromes based at least in part on the partial syndromes and eraser locator polynomial of the codeword. Further, the apparatus may include an error locator configured to generate an error locator polynomial using only a part of the modified partial syndromes. With the error locator polynomial and the erasure locator polynomial, errors and erasures in the codeword may be potentially located and fixed more efficiently and/or economically, to be more fully described below.

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

Where the disclosure recites "a" or "a first" element or the equivalent thereof, such disclosure includes one or more such elements, neither requiring nor excluding two or more such elements. Further, ordinal indicators (e.g., first, second or third) for identified elements are used to distinguish between the elements, and do not indicate or imply a required or limited number of such elements, nor do they indicate a particular position or order of such elements unless otherwise specifically stated.

The description may use the phrases "in one embodiment", "in an embodiment", "in another embodiment", "in embodiments", "in some embodiments", "in various embodiments", or the like, which may each refer to one or more of the same or different embodiments. Furthermore, the terms "comprising", "including", "having", and the like, as used with respect to embodiments of the present disclosure, are synonymous.

Referring now to FIG. 1, a block diagram is shown illustrating an example apparatus incorporating aspects of the present disclosure, in accordance with various embodiments. In embodiments, apparatus 100 may be used in decoding errors and erasures in a codeword of an error-correcting code (ECC) memory. In embodiments, apparatus 100 may be an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

In some embodiments, apparatus 100 may be used in memory systems such as a two-level memory system. Apparatus 100 may reduce latency of the two-level memory system, in the event of device failures, to be described more fully below. In some embodiments, apparatus 100 may be used in data storage systems such as compact disks (CD), digital versatile discs (DVD), Blu-ray discs, redundant array of independent disks (RAID), or solid-state drive (SSD). In some embodiments, apparatus 100 may be used in consumer electronics such as bar code reader such as quick response (QR) code reader. In some embodiments, apparatus 100 may be used with data transmission technologies such as digital subscriber line (DSL) and worldwide interoperability for microwave access (WiMAX). In some embodiments, apparatus 100 may be used in broadcast systems such as digital video broadcasting (DVB) and advanced television systems committee (ATSC) systems. In some embodiments, apparatus 100 may be used in deep space and satellite communications such as used in the Mars Pathfinder or Mars Exploration Rover missions.

In embodiments, apparatus 100 may include syndrome calculator 110, erasure locator 120, syndrome modifier 130, error locator 140, and error corrector 150, coupled with each other as shown. In embodiments, apparatus 100, or more specifically, elements of apparatus 100, may treat RS codes as cyclic BCH codes. As those skilled in the art would appreciate, BCH codes are a class of cyclic error-correcting codes constructed using finite fields. Thus, encoding symbols may be derived from the coefficients of a polynomial constructed by multiplying the message polynomial with a generator polynomial. Errors may be introduced to a codeword during storage, read or write, or in transmission. In embodiments, syndrome calculator 110 may be configured to compute the partial syndromes of a codeword after receiving the codeword. If the partial syndromes are all zero, then the codeword may be received without error. In some embodiments, partial syndromes may be represented by a finite syndrome polynomial. In some embodiments, as will be described in more detail below, partial syndromes may be used in decoding.

As described earlier, an erasure is a potential error with a known location. When receiving a codeword transmitted over a noisy channel, or reading a codeword from a memory device, unreliable bits in the codeword may be flagged as erasures. Flagging a symbol as an erasure may use the correction strength of only half of a symbol. For example, when flagging 10 symbols that are very likely to be errors, only 5 symbol correction strength may be used. Accordingly, embodiments of the disclosure leverage the erasure locations are known to effectuate decoding to correct errors. In embodiments, erasure locator 120 may be configured to generate an erasure locator polynomial, upon receiving erased locations. The erasure locator polynomial may be used later, in combination with the aforementioned syndrome polynomial, in generating a modified syndrome polynomial. Further, the erasure locator polynomial may be used in calculating erasure values for decoding the codeword.

In embodiments, syndrome modifier 130 may be configured to modify the partial syndromes received from syndrome calculator 110, and generate modified partial syndromes which may be sent to error locator 140. In embodiments, error locator 140 may be configured to generate an error locator polynomial with the modified partial syndromes as the input. The Berlekamp-Massey algorithm is an iterative procedure for finding the error locator polynomial. In embodiments, error locator 140 may be configured to use the BMA in finding the error locator polynomial. In embodiments, error locator 140 may be configured to use BMA in finding the error locator polynomial for the codeword using only a subset of the modified partial syndromes. In embodiments, error locator 140 may be configured to use a Euclidean algorithm instead of the BMA algorithm in finding the error locator polynomial.

In embodiments, error corrector 150 may be configured to complete the error and erasure decoding process using any known methods in the art, upon receiving the error locator polynomial from error locator 140 and the erasure locator polynomial from erasure locator 120.

Figure 2:
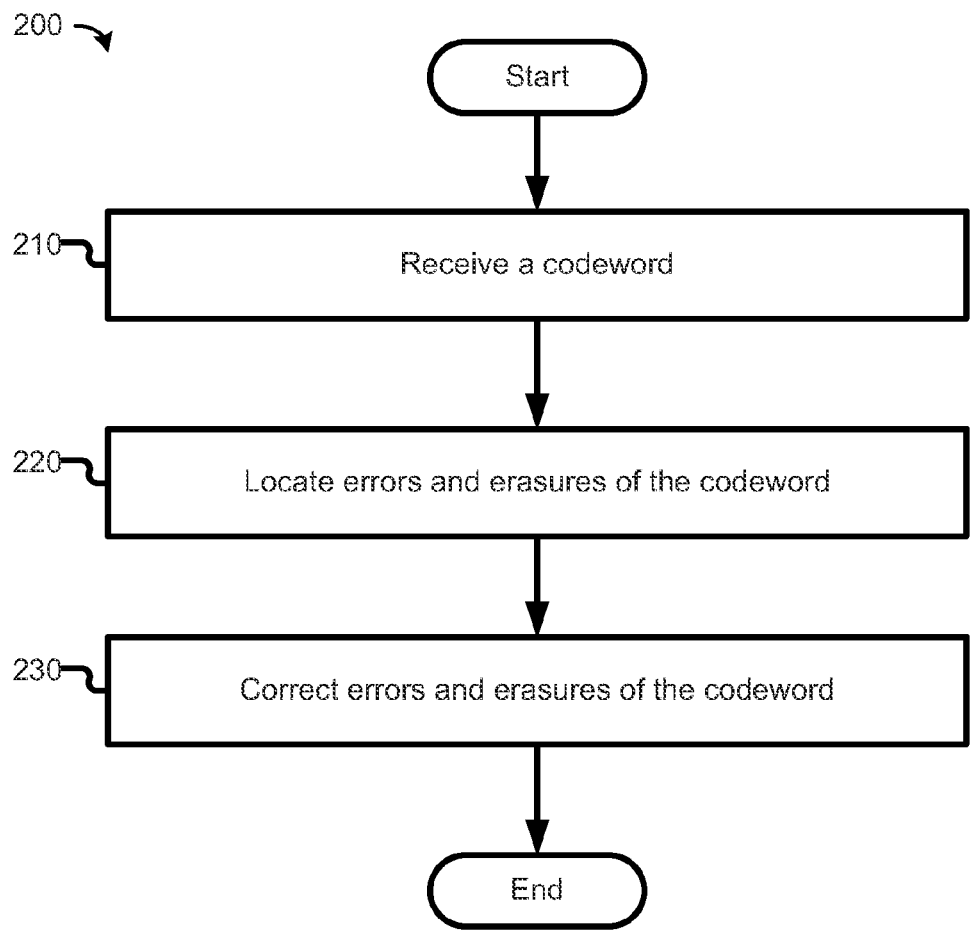
FIG. 2 illustrates an example error and erasure decoding process incorporating aspects of the present disclosure, in accordance with various embodiments.

Referring now to FIG. 2, it is a flow diagram of an example error and erasure decoding process 200 incorporating aspects of the present disclosure, in accordance with various embodiments. As shown, process 200 may be performed by apparatus 100 to implement one or more embodiments of the present disclosure. In embodiments, the process may begin at block 210, where a codeword with errors and erasures may be received by apparatus 100, e.g. from a memory device. Next, at block 220, errors and erasures of the codeword may be located, with more details to be described below in connection with FIG. 3. Next, at block 230, errors and erasures of the codeword may be corrected, with more details to be described below. In some embodiments, process 200 may then be repeated starting at block 210 for locating and correcting additional errors and erasures of codewords. In some embodiments, process 200 may end, e.g. if all codewords requiring correction of errors and erasures have been processed.

Figure 3:
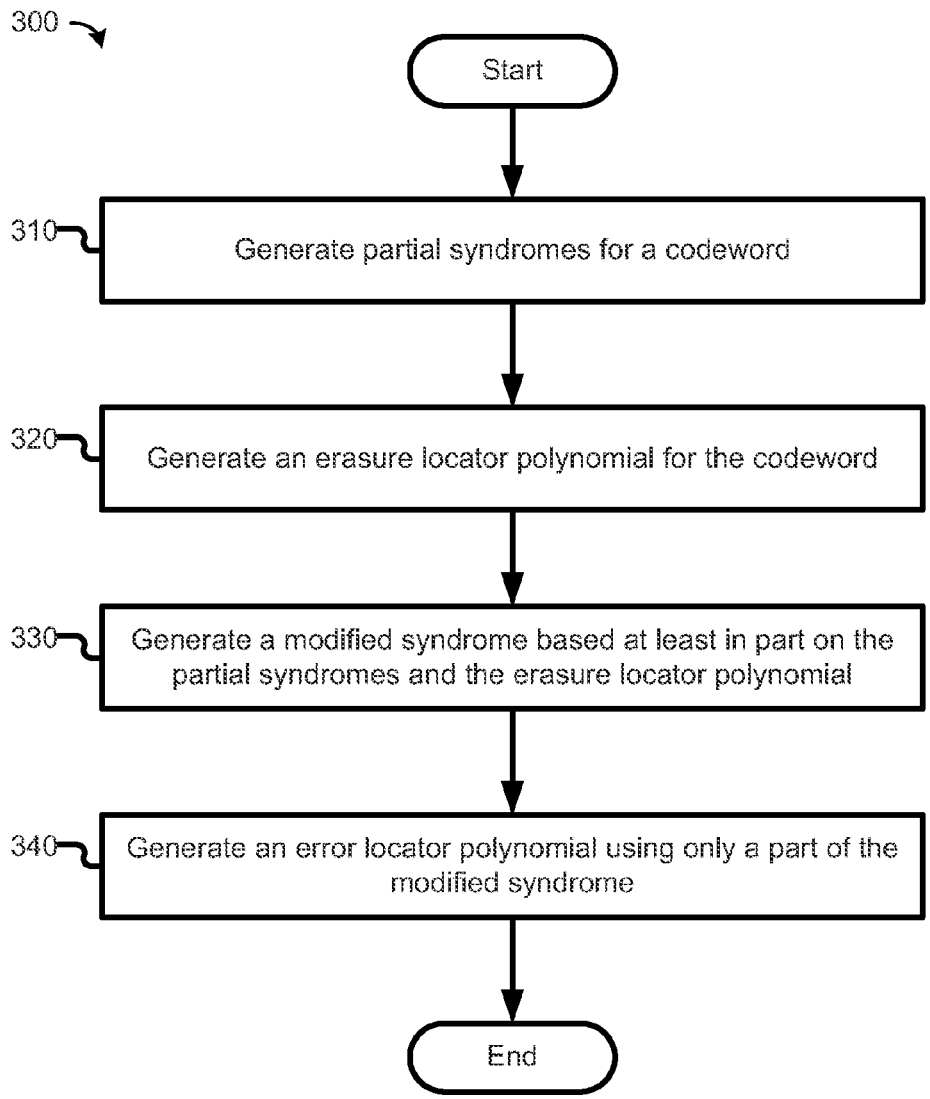
FIG. 3 illustrates an example error and erasure locating process incorporating aspects of the present disclosure, in accordance with various embodiments.

Referring now to FIG. 3, it is a flow diagram of an example error and erasure locating process 300 incorporating aspects of the present disclosure, in accordance with various embodiments. As shown, process 300 may be performed by apparatus 100 to implement one or more embodiments of the present disclosure, particularly in connection with the block 220 in FIG. 2. In embodiments, the process may begin at block 310, where the partial syndromes, $S_1 \ldots S_{2t}$, for a codeword may be generated, for example, by syndrome calculator 110. As an example, the partial syndromes, $S_1 \ldots S_{2t}$, may be generated by the following equations in the Galois field GF(q).

$$S_1 = r(\alpha) = e_1 \alpha^{j_1} + e_2 \alpha^{j_2} + e_3 \alpha^{j_3} + \ldots$$
$$S_2 = r(\alpha^2) = e_1 \alpha^{2j_1} + e_2 \alpha^{2j_2} + e_3 \alpha^{2j_3} + \ldots$$
$$S_3 = r(\alpha^3) = e_1 \alpha^{3j_1} + e_2 \alpha^{3j_2} + e_3 \alpha^{3j_3} + \ldots$$
$$\ldots$$
$$S_{2t} = r(\alpha^{2t}) = e_1 \alpha^{2tj_1} + e_2 \alpha^{2tj_2} + e_3 \alpha^{2tj_3} + \ldots$$

where t is the number of correctable errors; $j_1$, $j_2$, etc. are the error locations; $e_1$, $e_2$, etc. are the error values; and r(x) is the received codeword represented as a polynomial.

In short, the partial syndromes $S_1 \ldots S_{2t}$, may be generated as:

$$S(x) = S_1 + S_2 x + S_3 x^2 + S_4 x^3 + \ldots = \sum_{n=1}^{\infty} \left( \sum_{i=1}^{A} e_i \alpha^{nj_i} \right) x^{n-1}$$

In embodiments, when erasures are included in the partial syndromes, $S_1 \ldots S_{2t}$, may be redefined and generated by the following equations.

$$S_1 = r(\alpha) = e_1 \alpha^{j_1} + e_2 \alpha^{j_2} + \ldots + f_1 \alpha^{k_2} + f_2 \alpha^{k_2} + \ldots$$
$$S_2 = r(\alpha^2) = e_1 \alpha^{2j_1} + e_2 \alpha^{2j_2} + \ldots + f_1 \alpha^{2k_2} + f_2 \alpha^{2k_2} + \ldots$$
$$S_3 = r(\alpha^3) = e_1 \alpha^{3j_1} + e_2 \alpha^{3j_2} + \ldots + f_1 \alpha^{3k_2} + f_2 \alpha^{3k_2} + \ldots$$
$$\ldots$$
$$S_{2t} = r(\alpha^{2t}) = e_1 \alpha^{2tj_1} + e_2 \alpha^{2tj_2} + \ldots + f_1 \alpha^{2tk_2} = f_2 \alpha^{2tk_2} + \ldots$$

where $k_1$, $k_2$, etc are the B erasure locations, and $f_1$, $f_2$, etc are the erasure values.

In short, the partial syndromes, $S_1 \ldots S_{2t}$, including erasures may be generated as:

$$S(x) = S_1 + S_2 x + S_3 x^2 + S_4 x^3 + \ldots = \sum_{n=1}^{\infty} \left( \sum_{i=1}^{A} e_i \alpha^{nj_i} + \sum_{i=1}^{B} f_i \alpha^{nk_i} \right) x^{n-1}$$

Next, at block 320, an erasure locator polynomial may be generated for the codeword, for example, by erasure locator 120. In embodiments, an erasure locator polynomial, $\beta(x)$, may be introduced for erasures, wherein $\beta(x)$ may be generated from the following equation.

$$\beta(x) = 1 + \beta_1 x + \beta_2 x^2 + \beta_3 x^3 + \ldots$$
$$= (1 + \alpha^{k_1} x)(1 + \alpha^{k_2} x)(1 + \alpha^{k_3} x) + \ldots$$
$$= \prod_{i=1}^{B} (1 + \alpha^{k_i} x)$$

wherein $k_1, k_2$, etc are the B erasure locations.

Next, at block 330, a modified partial syndromes, $T_{B+1} \ldots T_{2t}$, based at least in part on the partial syndromes and the erasure locator polynomial may be generated, for example, by syndrome modifier 130. As an example, a modified partial syndrome polynomial, $T(x)$, may be generated. $T(x)$ may be generated by the following equation.

$$T(x) = S(x)\beta(x)$$

In embodiments, modified partial syndromes, $T_{B+1} \ldots T_{2t}$, may be used to calculate the error locator polynomial, $\sigma(x)$, using the BMA, e.g., by error locator 140. For example, suppose there are B erasures and $(2t-B)/2$ errors wherein t is the number of correctable errors, then $S_1$ input to $BMA = T_{B+1}$ $S_2$ input to $BMA = T_{B+2}$ $S_3$ input to $BMA = T_{B+3}$ $\ldots$ $S_{(2t-B)/2}$ input to $BMA = T_{2t}$ It may be shown that only the last $(2t-B)$ partial syndromes may be useful for the BMA, and feeding the BMA with the modified partial syndromes $T_1$ to $T_B$ may be futile or even detrimental, wherein t is the number of correctable errors, and B is the number of erasures. Therefore, embodiments with feeding the BMA with only the last $(2t-B)$ partial syndromes may reduce the number of BMA iterations by B, thereby reducing latency, reducing power, and increasing throughput. For example, in a two-level memory system, when there is a die failure, B erasures may be identified for B symbols in the failed device. The performance of the two-level memory may significantly deteriorate without the teaching of this disclosure due to the overhead to decode B erasures. However, a system incorporated with the teaching of this disclosure may at least save the number of BMA iterations by B, thus at least potentially reducing the latency of the two-level memory system, and partially mitigates the loss in performance.

Further, a decoding process to correct 0 errors, 1 error, or 2 errors may be successfully completed with the feeding of modified partial syndromes of $T_{B+1}$ to $T_{2t}$, but may fail with the feeding of modified partial syndromes of $T_1$ to $T_{2t}$. Thus, when B is greater than t, a correct error locator polynomial may be successfully generated with the feeding of modified partial syndromes of $T_{B+1}$ to $T_{2t}$, but may not be generated with the feeding of all modified partial syndromes, for example, $T_1$ to $T_{2t}$.

Further, it may be demonstrated that the last $(2t-B)$ terms of $T(x)$ match the form of partial syndromes, $S_1 \ldots S_{2t}$, described above.

$$T(x) = S(x)\beta(x) = \left[ \sum_{n=1}^{\infty} \left( \sum_{i=1}^{A} e_i \alpha^{nj_i} + \sum_{i=1}^{B} f_i \alpha^{nk_i} \right) x^{n-1} \right] \left[ \prod_{i=1}^{B} (1 + \alpha^{k_i} x) \right]$$

$$= \left[ \sum_{n=1}^{\infty} \left( \sum_{i=1}^{A} e_i \alpha^{nj_i} + \sum_{i=2}^{B} f_i \alpha^{nk_i} + f_1 \alpha^{nk_1} \right) x^{n-1} \right] \left[ (1 + \alpha^{k_1} x) \prod_{i=2}^{B} (1 + \alpha^{k_i} x) \right]$$

$$= \left[ \prod_{i=2}^{B} (1 + \alpha^{k_i} x) \right] \left[ \left( \sum_{i=1}^{A} e_i \alpha^{j_i} + \sum_{i=1}^{B} f_i \alpha^{k_i} \right) + \sum_{n=2}^{\infty} \left( \sum_{i=1}^{A} e_i \alpha^{nj_i} + \sum_{i=2}^{B} f_i \alpha^{nk_i} + f_1 \alpha^{nk_1} + \alpha^{k_1} \left\{ \sum_{i=1}^{A} e_i \alpha^{(n-1)j_i} + \sum_{i=2}^{B} f_i \alpha^{(n-1)k_i} + f_1 \alpha^{(n-1)k_1} \right\} \right) x^{n-1} \right]$$

$$= \left[ \prod_{i=2}^{B} (1 + \alpha^{k_i} x) \right] \left[ \left( \sum_{i=1}^{A} e_i \alpha^{j_i} + \sum_{i=1}^{B} f_i \alpha^{k_i} \right) + \sum_{n=2}^{\infty} \left( \sum_{i=1}^{A} e_i \alpha^{(n-1)j_i} (\alpha^{j_i} + \alpha^{k_1}) + \sum_{i=2}^{B} f_i \alpha^{(n-1)k_i} (\alpha^{k_i} + \alpha^{k_1}) \right) x^{n-1} \right]$$

$$= \left[ \prod_{i=3}^{B} (1 + \alpha^{k_i} x) \right] \left[ \left( \sum_{i=1}^{A} e_i \alpha^{j_i} + \sum_{i=1}^{B} f_i \alpha^{k_i} \right) + \left( \sum_{i=1}^{A} e_i \alpha^{j_i} (\alpha^{j_i} + \alpha^{k_1}) + \sum_{i=2}^{B} f_i \alpha^{k_i} (\alpha^{k_i} + \alpha^{k_1}) \right) x + \right.$$

$$\left. \sum_{n=3}^{\infty} \left( \sum_{i=1}^{A} e_i \alpha^{(n-2)j_i} (\alpha^{j_i} + \alpha^{k_1})(\alpha^{j_i} + \alpha^{k_2}) + \sum_{i=3}^{B} f_i \alpha^{(n-2)k_i} (\alpha^{k_i} + \alpha^{k_1})(\alpha^{k_i} + \alpha^{k_2}) \right) x^{n-1} \right]$$

$$= \left[ \prod_{i=3}^{B} (1 + \alpha^{k_i} x) \right] \left[ \left( \sum_{i=1}^{A} e_i \alpha^{j_i} + \sum_{i=1}^{B} f_i \alpha^{k_i} \right) + \left( \sum_{i=1}^{A} e_i \alpha^{j_i} \prod_{b=1}^{1} (\alpha^{j_i} + \alpha^{k_b}) + \sum_{i=2}^{B} f_i \alpha^{k_i} \prod_{b=1}^{1} (\alpha^{k_i} + \alpha^{k_b}) \right) x + \right.$$

$$\left. \sum_{n=3}^{\infty} \left( \sum_{i=1}^{A} e_i \alpha^{(n-2)j_i} \prod_{b=1}^{2} (\alpha^{j_i} + \alpha^{k_b}) + \sum_{i=3}^{B} f_i \alpha^{(n-2)k_i} \prod_{b=1}^{2} (\alpha^{k_i} + \alpha^{k_b}) \right) x^{n-1} \right]$$

-continued $$= \left[\prod_{i=3}^{B}(1+\alpha^{k_i}x)\right]\left[\left(\sum_{i=1}^{A}e_i\alpha^{j_i}+\sum_{i=1}^{B}f_i\alpha^{k_i}\right)+\sum_{c=1}^{1}\left(\sum_{i=1}^{A}e_i\alpha^{j_i}\prod_{b=1}^{c}(\alpha^{j_i}+\alpha^{k_b})+\sum_{i=2}^{B}f_i\alpha^{k_i}\prod_{b=1}^{c}(\alpha^{k_i}+\alpha^{k_b})\right)x^c+$$

$$\sum_{n=3}^{\infty}\left(\sum_{i=1}^{A}e_i\alpha^{(n-2)j_i}\prod_{b=1}^{2}(\alpha^{j_i}+\alpha^{k_b})+\sum_{i=3}^{B}f_i\alpha^{(n-2)k_i}\prod_{b=1}^{2}(\alpha^{k_i}+\alpha^{k_b})\right)x^{n-1}\right]$$

$$= \left[\prod_{i=B}^{B}(1+\alpha^{k_i}x)\right]\left[\left(\sum_{i=1}^{A}e_i\alpha^{j_i}+\sum_{i=1}^{B}f_i\alpha^{k_i}\right)+\sum_{c=1}^{B-2}\left(\sum_{i=1}^{A}e_i\alpha^{j_i}\prod_{b=1}^{c}(\alpha^{j_i}+\alpha^{k_b})+\sum_{i=2}^{B}f_i\alpha^{k_i}\prod_{b=1}^{c}(\alpha^{k_i}+\alpha^{k_b})\right)x^c+$$

$$\sum_{n=B}^{\infty}\left(\sum_{i=1}^{A}e_i\alpha^{(n-B+1)j_i}\prod_{b=1}^{B-1}(\alpha^{j_i}+\alpha^{k_b})+\sum_{i=B}^{B}f_i\alpha^{(n-B+1)k_i}\prod_{b=1}^{B-1}(\alpha^{k_i}+\alpha^{k_b})\right)x^{n-1}\right]$$

$$= \left(\sum_{i=1}^{A}e_i\alpha^{j_i}+\sum_{i=1}^{B}f_i\alpha^{k_i}\right)+\sum_{c=1}^{B-1}\left(\sum_{i=1}^{A}e_i\alpha^{j_i}\prod_{b=1}^{c}(\alpha^{j_i}+\alpha^{k_b})+\sum_{i=2}^{B}f_i\alpha^{k_i}\prod_{b=1}^{c}(\alpha^{k_i}+\alpha^{k_b})\right)x^c+\sum_{n=B+1}^{\infty}\left(\sum_{i=1}^{A}e_i\alpha^{(n-B)j_i}\prod_{b=1}^{B}(\alpha^{j_i}+\alpha^{k_b})\right)x^{n-1}$$

$$= \left(\sum_{i=1}^{A}e_i\alpha^{j_i}+\sum_{i=1}^{B}f_i\alpha^{k_i}\right)+\sum_{c=1}^{B-1}\left(\sum_{i=1}^{A}e_i\alpha^{j_i}\prod_{b=1}^{c}(\alpha^{j_i}+\alpha^{k_b})+\sum_{i=2}^{B}f_i\alpha^{k_i}\prod_{b=1}^{c}(\alpha^{k_i}+\alpha^{k_b})\right)x^c+\sum_{n=1}^{\infty}\left(\sum_{i=1}^{A}e_i\left[\prod_{b=1}^{B}(\alpha^{j_i}+\alpha^{k_b})\right]\alpha^{nj_i}\right)x^{n+B-1}$$

Therefore, for $n\geq 1$, it may be demonstrated that the last terms of $T(x)$ follow the same pattern as $S(x)$, and may be used by the BMA.

Hence, the terms after $T_B$ in $T(x)$ may be written as:

$$T_{B+n} = \sum_{i=1}^{A} e'_i \alpha^{nj_i}$$

where $e'_i = e_i \prod_{b=1}^{B}(\alpha^{j_i+\alpha k_b})$

Therefore, in embodiments, for $n \geq 1$, one skilled in the art may appreciate that the last terms of $T(x)$ follow the same pattern as $S(x)$, and may be used by the BMA.

Next, at block 340, an error locator polynomial, $\sigma(x)$, may be generated using only a part of the modified syndromes as shown above. In embodiments, the BMA may be used in finding the error locator polynomial, $\sigma(x)$. For example, $\sigma(x)$ may be generated with the following equations in the BMA, with only a part of the modified syndromes, for example, $T_{B+1}$ to $T_{2t}$, in connection with the example illustrated at block 330.

$$\sigma(x) = \sigma_0 + \sigma_1 x + \sigma_2 x^2 + \sigma_3 x^3 + \ldots$$
$$= \sigma_0(1+\alpha^{j_1}x)(1+\alpha^{j_2}x)(1+\alpha^{j_3}x)+\ldots$$
$$= \prod_{i=1}^{A}(1+\alpha^{j_i}x)$$

Subsequently, error corrector 150 may complete the decoding process upon receiving the error evaluator polynomial and the erasure locator polynomial, using any one of a number of techniques known in the art. In embodiments, the decoding process may include generation of an error evaluator polynomial, $Z_0(x)$, e.g., by error corrector 150. In embodiments, $Z_0(x)$ may be calculated from $T(x)$ and $\sigma(x)$, for example, with the following equation.

$$Z_0(x) = [T(x)\sigma(x)] \text{modulo } x^{2t}$$

In embodiments, the errors and erasures locator polynomial, $\gamma(x)$, may be defined as:

$$\gamma(x) = \sigma(x)\beta(x)$$

Therefore, in embodiments, the error values may be calculated, e.g., by error corrector 150, as:

$$e_i = \frac{Z_0(\alpha^{-j_i})}{\gamma'(\alpha^{-j_i})}$$

Therefore, in embodiments, the erasure values may be calculated, e.g., by error corrector 150, as:

$$f_i = \frac{Z_0(\alpha^{-k_i})}{\gamma'(\alpha^{-k_i})}$$

Figure 4:
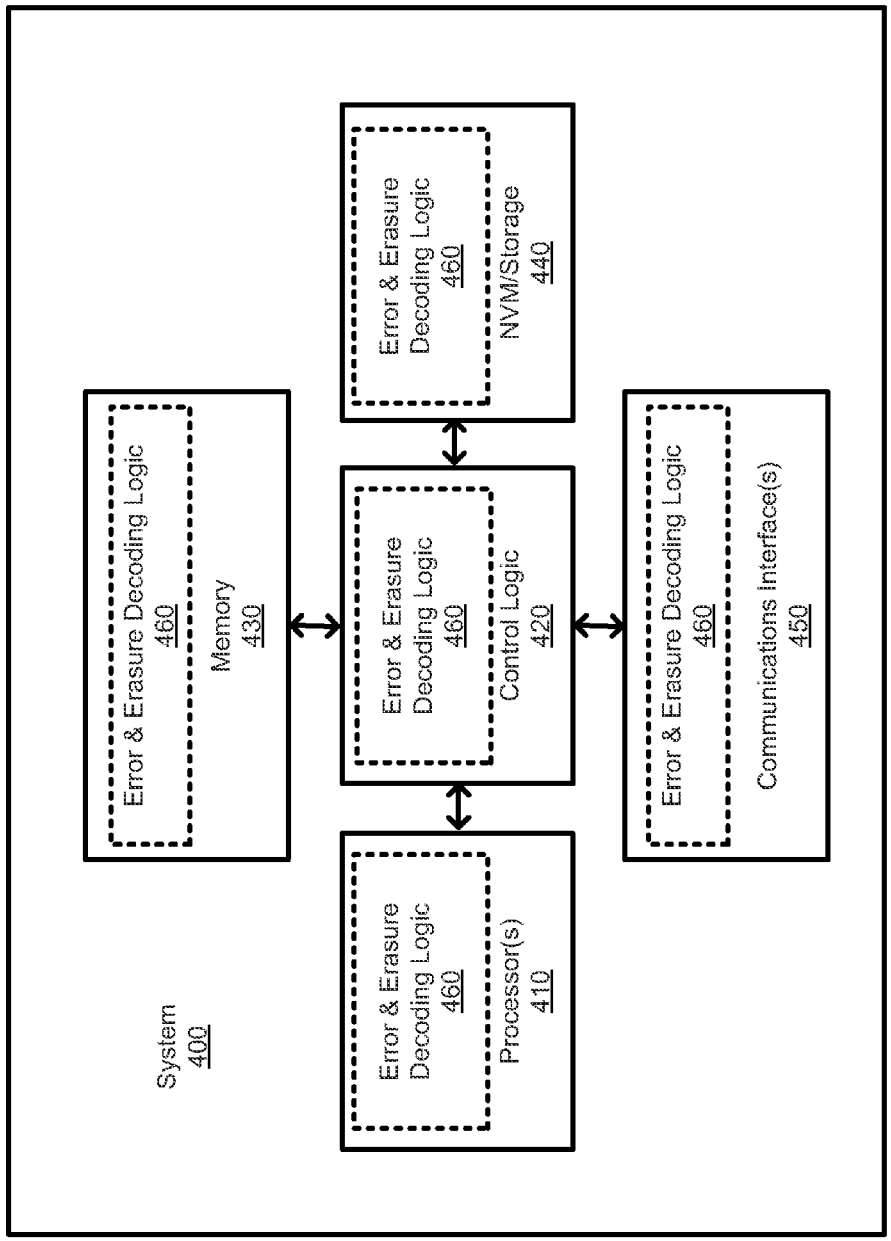
FIG. 4 illustrates an example computing system into which aspects of the present disclosure may be incorporated, in accordance with various embodiments.

FIG. 4 illustrates an example computing system 400 into which aspects of the present disclosure may be incorporated, in accordance with various embodiments. As illustrated, example computing system 400 may include one or more of the processor(s) 410, memory 430, non-volatile memory (NVM)/storage 440, and one or more communications interfaces 450 coupled with each other, e.g., via control logic 420. In embodiments, memory 430 and non-volatile memory (NVM)/storage 440 may form a two-level memory system. Further, each of the one or more processor(s) 410 may be include one or more processor cores.

In one embodiment, control logic 420 may include any suitable interface controllers to provide for any suitable interface to at least one of the processor(s) 410 and/or to any suitable device or component in communication with control logic 420. In another embodiment, control logic 420 may include one or more input/output (I/O) controller(s) to provide an interface to NVM/storage 440 and communications interfaces 450. Yet in another embodiment, control logic 420 may include one or more memory controller(s) to provide an interface to memory 430. Memory 430 may be used store data and/or instructions, for example, for system 400. In one embodiment, memory 430 may include any suitable volatile memory, such as suitable dynamic random access memory (DRAM), for example.

NVM/storage 440 may be used to store data and/or instructions. In embodiments, NVM/storage 440 may include any suitable non-volatile memory, including but not limited to NAND (flash) memory, ferroelectric random-access memory (FeTRAM), nanowire-based non-volatile memory, memory that incorporates memristor technology, MRAM, STT-MRAM, three dimensional (3D) cross point resistive memory such as phase change memory (PCM) and so forth. In embodiments, NVM/storage 440 may include any suitable non-volatile storage device(s), such as one or more hard disk drive(s) (HDD(s)), one or more solid-state drive(s), one or more compact disc (CD) drive(s), and/or one or more digital versatile disc (DVD) drive(s), for example.

NVM/storage 440 may include a storage resource physically part of a device on which the system 400 is installed or it may be accessible by, but not necessarily a part of, the device. For example, the NVM/storage 440 may be accessed over a network via communications interface(s) 450.

In some embodiments, memory 430 and/or NVM/storage 440 may include, in particular, hardware and/or software implementations of error and erasure decoding logic 460. The software portion of error and erasure decoding logic 460 may include instructions that when executed by at least one of the processor(s) 410 (or an embedded controller (not shown) result in the system 400 practicing one or more of the error and erasure decoding processes described above. In other embodiments, the hardware and/or software implementation of error and erasure decoding logic 460 may be located in processor(s) 410, control logic 420, and/or communications interface(s) 450.

In embodiments, as described earlier, error and erasure decoding logic 460 may be used in improving latency in multi-level memory, such as the two-level memory of memory 430 and NVM/storage 440. In embodiments, applications of two-level memory may be entirely within memory 430 or entirely within NVM/storage 440. In embodiments, slower memory may be used to supplement the capacity of faster memory, while the faster memory may serve as a cache for the slower memory. For example, an L1 processor cache and an L2 processor cache may form an example of a two-level memory. As another example, the L2 cache and DRAM may form another two-level memory. Yet as another example, DRAM and NVM/Storage 440 may form yet another two-level memory. Similarly, hybrid solid-state drives (SSD) may use NAND flash as a cache for slower hard disk drives (HDDs), and as an example, Intel® Cache Acceleration Software™ may enable NAND flash-based SSDs to act as a cache for slower HDDs.

In embodiments, higher error rates may be experienced by the slower memory, but the same level of reliability and levels of latency comparable to the faster memory may still be expected. In embodiments, NVM/storage 440 may have higher density and higher error rates but slower access time than memory 430, which may include register files, SRAM, DRAM, two-level memory, and/or other types of volatile or non-volatile memories. In embodiments, such as main memory applications, a significant latency difference between a cache hit and a cache miss may be very expensive in terms of overall system performance. When there are unreliable bits in the slower memory, the performance of two-level memory may slow down even further. If these unreliable bits may be flagged as erasures, then the latency for decoding the errors may be reduced. In embodiments, employing techniques of this disclosure as described earlier may significantly reduce the latency, and introduce more advantage for using error and erasure decoding logic 460 to decode both errors and erasures compared to decoding errors without flagging erasures. In embodiments, a lower decoding latency at higher error rates may enable NVM/storage 440, which may experience degradation in performance over time due to increased error rates, to be usable over an extended lifetime, and may consequently lower the annual service rate (ASR) for a computing system 400 in which it is installed.

Communications interface(s) 450 may provide an interface for system 400 to communicate over one or more network(s) and/or with any other suitable device. Communications interface(s) may include any suitable hardware and/or firmware, such as a network adapter, one or more antennas, a wireless interface, and so forth. In embodiments, communication interface(s) 450 may include an interface for system 400 to use NFC, optical communications (e.g., barcodes), Bluetooth or other similar technologies to communicate directly (e.g., without an intermediary) with another device. In embodiments, communication interface(s) 450 may include an interface for system 400 to be coupled to a wired or wireless, public and/or private, local and/or wide area networks, and to be used in data transmission, broadcasting, and/or deep space and satellite communications.

For one embodiment, at least one of the processor(s) 410 may be packaged together with control logic 420 and/or error and erasure decoding logic 460. For one embodiment, at least one of the processor(s) 410 may be packaged together with control logic 420 and/or error and erasure decoding logic 460 to form a System in Package (SiP). For one embodiment, at least one of the processor(s) 410 may be integrated on the same die with control logic 420 and/or error and erasure decoding logic 460. For one embodiment, at least one of the processor(s) 410 may be integrated on the same die with control logic 420 and/or error and erasure decoding logic 460 to form a System on Chip (SoC).

In various implementations, the system 400 may be a laptop, a netbook, a notebook, a subnotebook, an Ultrabook™, a smartphone, a tablet, a personal digital assistant, an ultramobile PC, a mobile phone, a desktop computer, a server, a printer, a scanner, a monitor, a set-top box, an entertainment control unit (e.g., a gaming console), a digital camera, a digital music player, a digital video recorder, a digital video player, or a bar code reader, enhanced with the teachings of the present disclosure. Additionally, other devices in the above-described interactions may be configured to perform various disclosed techniques.

Figure 5:
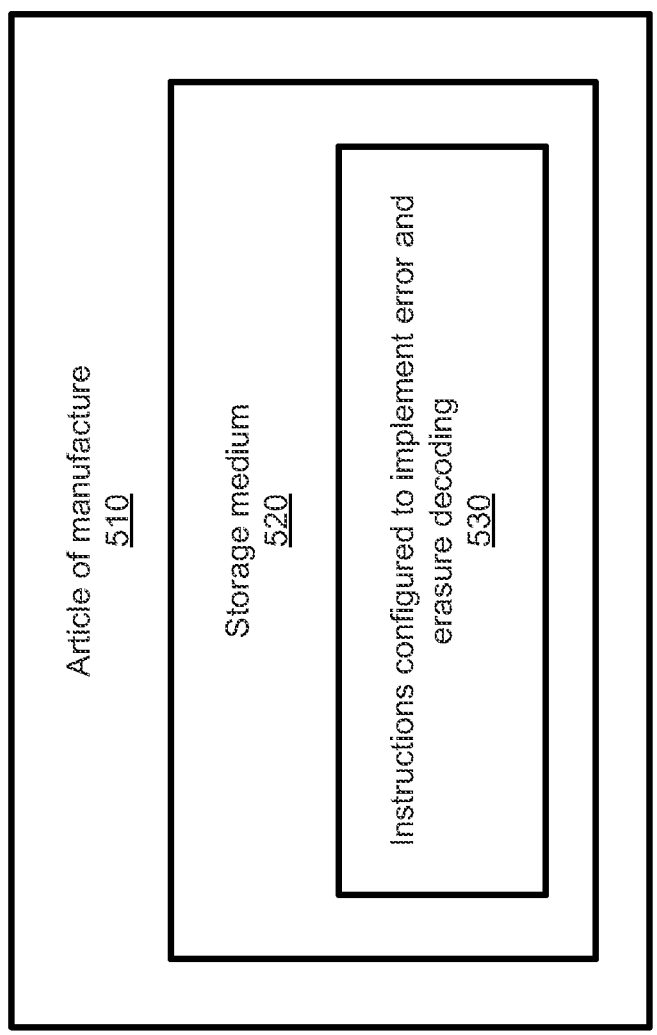
FIG. 5 illustrates an article of manufacture having programming instructions, incorporating aspects of the present disclosure, in accordance with various embodiments.

FIG. 5 illustrates an article of manufacture 510 having programming instructions, incorporating aspects of the present disclosure, in accordance with various embodiments. In various embodiments, an article of manufacture may be employed to implement various embodiments of the present disclosure. As shown, the article of manufacture 510 may include a computer-readable non-transitory storage medium 520 where instructions configured to implement error and erasure decoding 530 reside. The storage medium 520 may represent a broad range of persistent storage medium known in the art, including but not limited to flash memory, dynamic random access memory, static random access memory, an optical disk, a magnetic disk, etc. Instructions 530 may enable an apparatus, in response to their execution by the apparatus, to perform various operations described herein. For example, storage medium 520 may include instructions 530 configured to cause an apparatus or system to practice some or all aspects of error and erasure decoding of the process 200 of FIG. 2 and/or the process 300 of FIG. 3, in accordance with embodiments of the present disclosure.

Thus, apparatus, methods, and storage medium associated with error and erasure decoding have been described. The following paragraphs describe examples of various embodiments.

Example 1 is an apparatus for decoding errors and erasures which may include a syndrome calculator configured to generate a plurality of partial syndromes of a codeword; an erasure locator configured to generate an erasure locator polynomial for the codeword; a syndrome modifier, coupled with the syndrome calculator and the erasure locator, configured to generate modified partial syndromes for the codeword based at least in part on the partial syndromes and the erasure locator polynomial for the codeword; and an error locator, coupled with the syndrome modifier, configured to generate an error locator polynomial using the modified partial syndromes, for error and erasure decoding of the codeword.

Example 2 may include the subject matter of Example 1, and further specifies that the error locator may be configured to use a Berlekamp-Massey algorithm to generate the error locator polynomial.

Example 3 may include the subject matter of Example 1 or 2, and further specifies that the modified partial syndromes may include no more than (2t−B) partial syndromes, wherein t is the number of correctable errors, and B is the number of erasures.

Example 4 may include the subject matter of Example 3, and further specifies that B may be greater than t.

Example 5 may include the subject matter of any one of Examples 1-4, and further specifies that the apparatus may be a memory controller.

Example 6 may include the subject matter of any one of Examples 1-4, and further specifies that the apparatus may be a microprocessor which may include a memory controller having the syndrome calculator, the erasure locator, the syndrome modifier, and the error locator; and one or more processor cores coupled with the memory controller.

Example 7 may include the subject matter of any one of Examples 1-4, and further specifies that the apparatus may be a computing device which may include a system memory; and a microprocessor, coupled with the system memory, having the syndrome calculator, the erasure locator, the syndrome modifier, and the error locator.

Example 8 may include the subject matter of Example 7, and further specifies that the computing device may be a selected one of a laptop, a netbook, a notebook, an Ultrabook™, a smartphone, a tablet, a personal digital assistant, an ultra-mobile PC, a mobile phone, a desktop computer, a server, a printer, a scanner, a monitor, a set-top box, an entertainment control unit, a digital camera, a portable music player, a digital video player, or a bar code reader.

Example 9 is one or more storage medium having a plurality of instructions configured to cause a memory controller, in response to execution of the plurality of instructions by the memory controller, to: generate a plurality of partial syndromes for a codeword; generate an erasure locator polynomial for the codeword; generate modified partial syndromes based at least in part on the plurality of partial syndromes and the erasure locator polynomial of the codeword; and generate an error locator polynomial using the modified partial syndromes, for error and erasure decoding of the codeword.

Example 10 may include the subject matter of Example 9, and further specifies that the error locator polynomial may be generated using a Berlekamp-Massey algorithm.

Example 11 may include the subject matter of Example 8 or 9, and further specifies that the modified partial syndromes may include no more than (2t−B) partial syndromes wherein t is the number of correctable errors, and B is the number of erasures.

Example 12 may include the subject matter of Example 11, and further specifies that B may be greater than t.

Example 13 is a method for decoding errors and erasures which may include: generating, by a memory controller, a plurality of partial syndromes for a codeword; generating, by the memory controller, an erasure locator polynomial for the codeword; generating, by the memory controller, modified partial syndromes based at least in part on the plurality of partial syndromes and the erasure locator polynomial of the codeword; and generating, by the memory controller, an error locator polynomial using only a part of the modified syndrome, for error and erasure decoding of the codeword.

Example 14 may include the subject matter of Example 13, and further specifies that the error locator polynomial may be generated using a Berlekamp-Massey algorithm.

Example 15 may include the subject matter of Example 13 or 14, and further specifies that the modified partial syndromes may include no more than (2t−B) partial syndromes wherein t is the number of correctable errors, and B is the number of erasures.

Example 16 may include the subject matter of Example 15, and further specifies that B may be greater than t.

Example 17 is an apparatus for decoding errors and erasures which may include means for generating a plurality of partial syndromes for a codeword; means for generating an erasure locator polynomial for the codeword; means for generating modified partial syndromes for the codeword based at least in part on the plurality of partial syndromes and the erasure locator polynomial of the codeword; and means for generating an error locator polynomial for the codeword using the modified partial syndromes, for error and erasure decoding of the codeword.

Example 18 may include the subject matter of Example 17, and further specifies that the means for generating an erasure locator polynomial may include means for generating the erasure locator polynomial using a Berlekamp-Massey algorithm.

Example 19 may include the subject matter of Example 17 or 18, and further specifies that the modified partial syndromes may include no more than (2t−B) partial syndromes, wherein t is the number of correctable errors, and B is the number of erasures.

Example 20 may include the subject matter of Example 19, and further specifies that B may be greater than t.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims.

What is claimed is:

1. An apparatus, comprising:
a syndrome calculator configured to generate a plurality of partial syndromes of a codeword;
an erasure locator configured to generate an erasure locator polynomial for the codeword;
a syndrome modifier, coupled with the syndrome calculator and the erasure locator, configured to generate modified partial syndromes for the codeword based at least in part on the partial syndromes and the erasure locator polynomial for the codeword; and
an error locator, coupled with the syndrome modifier, configured to generate an error locator polynomial using no more than last (2t−B) partial syndromes of the modified partial syndromes, for error and erasure decoding of the codeword, wherein t is a number of correctable errors, and B is a number of erasures associated with the codeword.

2. The apparatus according to claim 1, wherein the error locator is configured to use a Berlekamp-Massey algorithm to generate the error locator polynomial.

3. The apparatus according to claim 1, wherein B is greater than t.

4. The apparatus according to claim 1, wherein the apparatus is a memory controller.

5. The apparatus according to claim 1, wherein the apparatus is a microprocessor comprising:
- a memory controller having the syndrome calculator, the erasure locator, the syndrome modifier, and the error locator; and
- one or more processor cores coupled with the memory controller.

6. The apparatus according to claim 1, wherein the apparatus is a computing device, comprising:
- a system memory; and
- a microprocessor, coupled with the system memory, having the syndrome calculator, the erasure locator, the syndrome modifier, and the error locator.

7. The apparatus according to claim 6, wherein the computing device is a selected one of a laptop, a netbook, a notebook, an ultrabook, a smartphone, a tablet, a personal digital assistant, an ultra-mobile PC, a mobile phone, a desktop computer, a server, a printer, a scanner, a monitor, a set-top box, an entertainment control unit, a digital camera, a portable music player, a digital video player, or a bar code reader.

8. One or more non-transient machine readable storage medium having a plurality of instructions configured to cause a memory controller, in response to execution of the plurality of instructions by the memory controller, to:
- generate a plurality of partial syndromes for a codeword;
- generate an erasure locator polynomial for the codeword;
- generate modified partial syndromes based at least in part on the plurality of partial syndromes and the erasure locator polynomial of the codeword; and
- generate an error locator polynomial using no more than last (2t−B) partial syndromes of the modified partial syndromes, for error and erasure decoding of the codeword, wherein t is a number of correctable errors, and B is a number of erasures associated with the codeword.

9. The one or more non-transient machine readable storage medium according to claim 8,
wherein the error locator polynomial is generated using a Berlekamp-Massey algorithm.

10. The one or more non-transient machine readable storage medium according to claim 8, wherein B is greater than t.

11. A method, comprising:
- generating, by a memory controller, a plurality of partial syndromes for a codeword;
- generating, by the memory controller, an erasure locator polynomial for the codeword;
- generating, by the memory controller, modified partial syndromes based at least in part on the plurality of partial syndromes and the erasure locator polynomial of the codeword; and
- generating, by the memory controller, an error locator polynomial using no more than last (2t−B) partial syndromes of the modified partial syndromes, for error and erasure decoding of the codeword, wherein t is a number of correctable errors, and B is a number of erasures.

12. The method of claim 11, wherein a Berlekamp-Massey algorithm is used in generating the error locator polynomial.

13. The method of claim 11, wherein B is greater than t.

14. An apparatus, comprising:
- means for generating a plurality of partial syndromes for a codeword;
- means for generating an erasure locator polynomial for the codeword;
- means for generating modified partial syndromes for the codeword based at least in part on the plurality of partial syndromes and the erasure locator polynomial of the codeword; and
- means for generating an error locator polynomial for the codeword using no more than last (2t−B) partial syndromes of the modified partial syndromes, for error and erasure decoding of the codeword, wherein t is a number of correctable errors, and B is a number of erasures associated with the codeword.

15. The apparatus of claim 14, wherein the means for generating an erasure locator polynomial comprises means for generating the erasure locator polynomial using a Berlekamp-Massey algorithm.

16. The apparatus of claim 14, wherein B is greater than t.

* * * * *